（12）United States Patent
Asako et al.

(10) Patent No.: US 10,923,332 B2
(45) Date of Patent: *Feb. 16, 2021

(54) PLASMA PROCESSING METHOD (71) Applicant: TOKYO ELECTRON LIMITED, Tokyo (JP)

(72) Inventors: Ryuichi Asako, Miyagi (JP); Masahiro Tabata, Miyagi (JP); Takao Funakubo, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/391,518

(22) Filed: Apr. 23, 2019

(65) Prior Publication Data
US 2019/0326104 A1     Oct. 24, 2019

(30) Foreign Application Priority Data

Apr. 23, 2018  (JP) .................................. 2018-082128

(51) Int. Cl.
| H01J 37/32 | (2006.01) |
| C23C 16/44 | (2006.01) |
| C23C 16/30 | (2006.01) |
| C23C 16/56 | (2006.01) |
| C23C 16/46 | (2006.01) |

(52) U.S. Cl.
CPC ........ *H01J 37/32642* (2013.01); *C23C 16/30* (2013.01); *C23C 16/44* (2013.01); *C23C 16/46* (2013.01); *C23C 16/56* (2013.01); *H01J 37/3288* (2013.01); *H01J 37/32522* (2013.01); *H01J 37/32532* (2013.01); *H01J 37/32623* (2013.01); *H01J 37/32724* (2013.01); *H01J 37/32935* (2013.01)

(58) Field of Classification Search
None
See application file for complete search history.

(56) References Cited

U.S. PATENT DOCUMENTS

| 2006/0213864 A1 | 9/2006 | Tahara et al. | |
| 2007/0204797 A1* | 9/2007 | Fischer | H01J 37/32642 118/723 R |
| 2015/0206763 A1* | 7/2015 | Suzuki | H01J 37/32642 438/706 |

FOREIGN PATENT DOCUMENTS

JP        2006-0269879 A    10/2006

* cited by examiner

*Primary Examiner* — Jiong-Ping Lu
(74) *Attorney, Agent, or Firm* — Rothwell, Figg, Ernst & Manbeck, P.C.

(57) ABSTRACT

A plasma processing method is performed in a state where a focus ring is disposed on a supporting table to surround an edge of a substrate by a plasma processing apparatus. The plasma processing apparatus includes a chamber and the supporting table provided in the chamber and configured to support the substrate mounted thereon. The plasma processing method includes forming an organic film on the focus ring to reduce a difference between a position of an upper surface of the focus ring in a vertical direction and a reference position, and performing plasma processing on the substrate after the formation of the organic film.

12 Claims, 7 Drawing Sheets

PLASMA PROCESSING METHOD

CROSS-REFERENCE TO RELATED APPLICATION

This application claims priority to Japanese Patent Application No. 2018-082128 filed on Apr. 23, 2018, the entire contents of which are incorporated herein by reference.

TECHNICAL FIELD

The present disclosure relates to a plasma processing method.

BACKGROUND

In manufacturing electronic devices, plasma processing is performed on a substrate. When the plasma processing is performed, the substrate is placed in a chamber of a plasma processing apparatus. In the chamber, plasma of a processing gas is generated. The substrate is treated with ions supplied from the plasma.

When the plasma processing is performed, a focus ring is arranged to surround the edge of the substrate. By using the focus ring, the shape of the interface between the plasma and the sheath is adjusted such that ions are vertically incident from the center of the substrate to the edge of the substrate. The focus ring is described in, e.g., Japanese Patent Application Publication No. 2006-269879.

SUMMARY

In accordance with an aspect of the present disclosure, there is provided a plasma processing method. In the plasma processing method, a plasma processing apparatus is used. The plasma processing apparatus includes a chamber and the supporting table. The supporting table is provided in the chamber and configured to support the substrate mounted thereon. The plasma processing method is performed in a state where a focus ring is disposed on the supporting table to surround an edge of a substrate. The plasma processing method includes: forming an organic film on the focus ring to reduce a difference between a position of an upper surface of the focus ring in a vertical direction and a reference position; and performing plasma processing on the substrate after the formation of the organic film.

BRIEF DESCRIPTION OF THE DRAWINGS

The objects and features of the present disclosure will become apparent from the following description of embodiments, given in conjunction with the accompanying drawings, in which.

DETAILED DESCRIPTION

Hereinafter, embodiments will be described in detail with reference to the accompanying drawings. Like reference numerals will be given to like or corresponding parts throughout the drawings.

Figure 1:
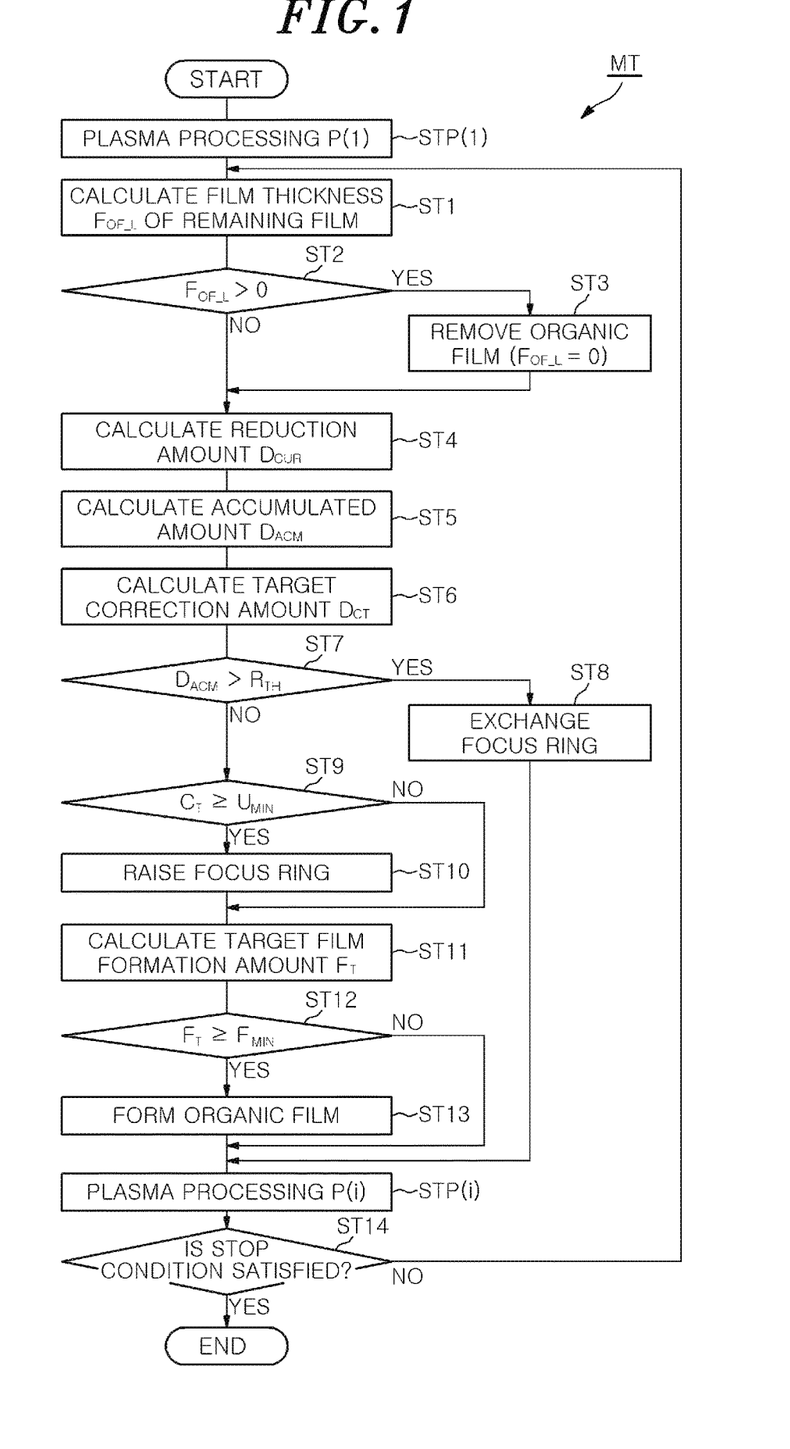
FIG. 1 is a flowchart showing a plasma processing method according to an embodiment.
Figure 2:
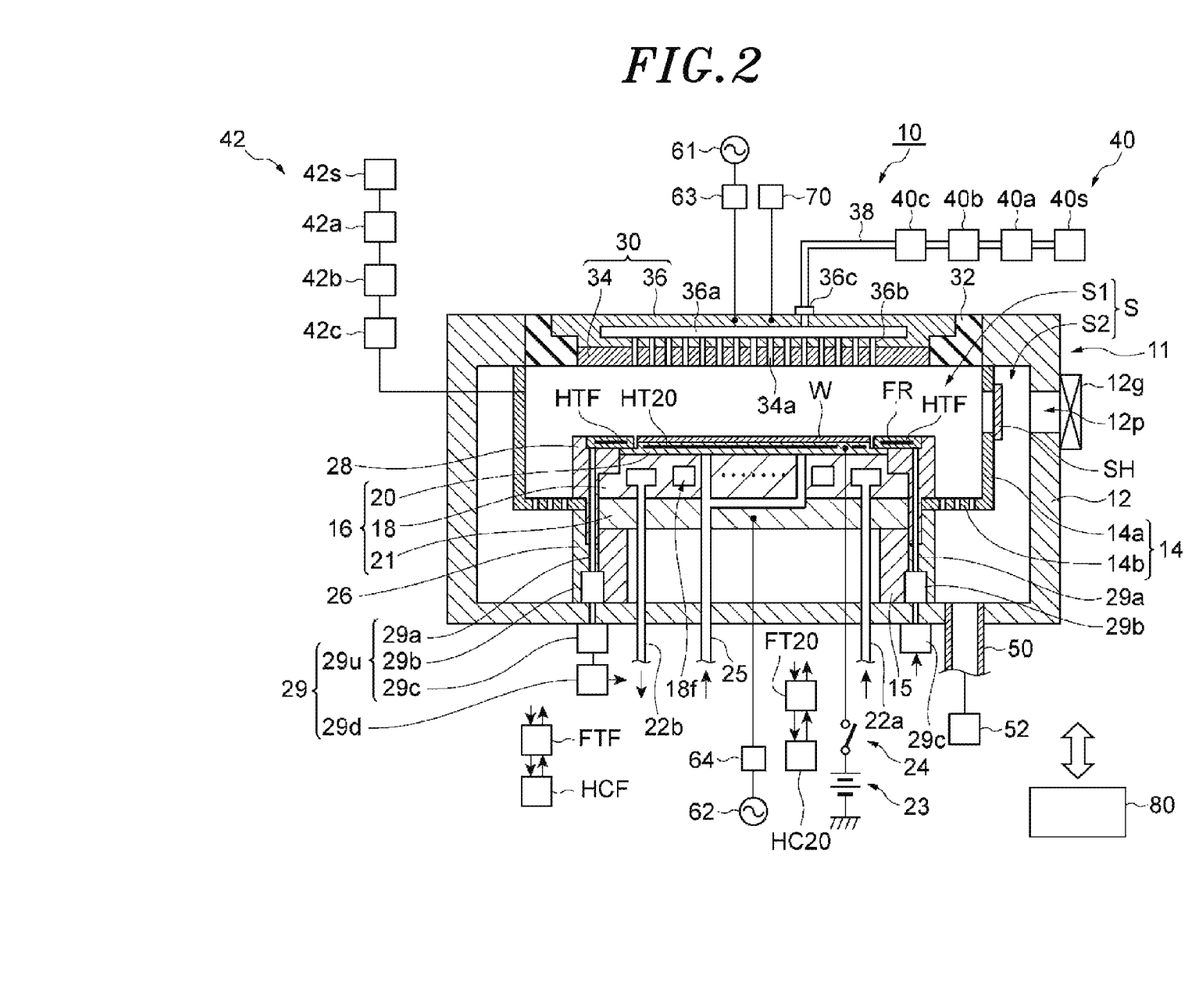
FIG. 2 shows an exemplary plasma processing apparatus that can be used to perform the method shown in FIG. 1.

FIG. 1 is a flowchart showing a plasma processing method according to an embodiment. In the plasma processing method shown in FIG. 1 (hereinafter, referred to as "method MT"), plasma processing is performed on a substrate by using a plasma processing apparatus. FIG. 2 shows an exemplary plasma processing apparatus that can be used to perform the method shown in FIG. 1. A plasma processing apparatus 10 shown in FIG. 2 is a capacitively coupled plasma processing apparatus.

The plasma processing apparatus 10 includes a chamber 11. The chamber 11 has therein an inner space S. The inner space S includes a first space S1 and a second space S2. The chamber 11 includes a chamber body 12. The chamber body 12 has a substantially cylindrical shape. The chamber body 12 has therein the inner space S. The chamber body 12 is made of, e.g., aluminum. The chamber body 12 is connected to a ground potential. A corrosion resistant film is formed on an inner wall surface of the chamber body 12, i.e., the surface of the chamber body 12 that defines the inner space S. The corrosion resistant film may be a film formed by anodic oxidation treatment or a ceramic film made of yttrium oxide.

A passage 12p is formed in a sidewall of the chamber body 12. The substrate W is transferred between the inner space S and the outside of the chamber 11 through the passage 12p. The passage 12p can be opened and closed by a gate valve 12g. The gate valve 12g is provided along the sidewall of the chamber body 12.

A partition wall 14 is provided in the inner space S. The partition wall 14 extends on the boundary between the first space S1 and the second space S2. A plurality of through-holes is formed in the partition wall 14 so that the first space S1 and the second space S2 communicate with each other. The partition wall 14 can be formed by forming a corrosion resistant film on a surface of a base material. The corrosion resistance film may be a film formed by anodic oxidation treatment or a ceramic film made of yttrium oxide. The base material is made of, e.g., aluminum. An opening is formed in the partition wall 14 to face the passage 12p. The substrate W is transferred between the first space S1 and the outside of the chamber 11 through the opening of the passage 12p and the partition wall 14. The opening of the partition wall 14 can be opened and closed by a shutter SH.

The partition wall 14 may include a shield portion 14a and a baffle plate 14b. The shield portion 14a has a substantially cylindrical shape. The shield portion 14a extends in a vertical direction along the sidewall of the chamber body 12 in the inner space S. The shield portion 14a is separated from the sidewall of the chamber body 12. An upper end of the shield portion 14a extends to an upper portion of the chamber 11 and is fixed to the upper portion of the chamber 11. In the plasma processing apparatus 10, substrate treatment such as plasma etching is performed in the first space S1. During the substrate treatment, by-products such as reaction products and the like are generated. The amount of the by-products adhered to the surface of the chamber body 12 is reduced by the shield portion 14a.

The baffle plate 14b extends in a direction orthogonal to the shield portion 14a. The baffle plate 14b extends between the shield portion 14a and a supporting table to be described later. The above-described through-holes of the partition wall 14 are formed in the baffle plate 14b. The shield portion 14a and the baffle plate 14b may be formed as one unit or may be separable from each other.

In the inner space S, a supporting part 15 extends upward from a bottom portion of the chamber body 12. The supporting part 15 has a substantially cylindrical shape and is made of an insulating material such as quartz. A supporting table 16 is mounted on the supporting part 15. The supporting table 16 is supported by the supporting part 15. The supporting table 16 is configured to support the substrate W in the first space S1. The supporting table 16 includes a lower electrode 18 and an electrostatic chuck 20. The supporting table 16 may further include an electrode plate 21. The electrode plate 21 is made of a conductive material such as aluminum or the like and has a substantially disc shape. The lower electrode 18 is provided on the electrode plate 21. The lower electrode 18 is made of a conductive material such as aluminum or the like and has a substantially disc shape. The lower electrode 18 is electrically connected to the electrode plate 21.

A flow path 18$f$ is provided in the lower electrode 18. The flow path 18$f$ is a channel for a heat exchange medium. As for the heat exchange medium, a liquid coolant or a coolant (e.g., Freon) for cooling the lower electrode 18 by vaporization thereof is used. The heat exchange medium is supplied to the flow path 18$f$ from a chiller unit provided outside the chamber body 12 through a line 22$a$. The heat exchange medium supplied to the flow path 18$f$ is returned to the chiller unit through a line 22$b$. In this manner, the heat exchange medium is supplied to the flow path 18$f$ and circulates between the flow path 18$f$ and the chiller unit.

The electrostatic chuck 20 is provided on the lower electrode 18. The electrostatic chuck 20 includes a main body and an electrode. The main body of the electrostatic chuck 20 is made of a dielectric material and has a substantially disc shape. The electrode of the electrostatic chuck 20 is a film-shaped electrode and is provided in the main body of the electrostatic chuck 20. A DC power supply 23 is electrically connected to the electrode of the electrostatic chuck 20 via a switch 24. When a voltage is applied from the DC power supply 23 to the electrode of the electrostatic chuck 20, an electrostatic attractive force is generated between the substrate W mounted on the electrostatic chuck 20 and the electrostatic chuck 20. Due to the electrostatic attractive force thus generated, the substrate W is attracted to and held on the electrostatic chuck 20.

The plasma processing apparatus 10 further includes a gas supply line 25. A heat transfer gas, e.g., He gas, is supplied through the gas supply line 25 from a gas supply unit to a gap between an upper surface of the electrostatic chuck 20 and a backside (bottom surface) of the substrate W.

One or more heaters HT20 (e.g., resistance heating elements) may be provided in the electrostatic chuck 20. Power is supplied from a heater controller HC20 to the heaters HT20. A high frequency filter FT20 may be provided between the heaters HT20 and the heater controller HC20 to prevent the high frequency power from flowing into the heater controller HC20. When the heaters HT20 are provided in the electrostatic chuck 20, temperatures of a plurality of regions of the electrostatic chuck 20 can be individually controlled by controlling the power supplied from the heater controller HC20 to the heaters HT20. Accordingly, it is possible to control temperature distribution in the plane of the electrostatic chuck 20 (i.e., in the plane of the substrate W).

A focus ring FR is disposed on an outer peripheral region of the electrostatic chuck 20. The focus ring FR has a substantially annular plate shape. The focus ring FR is made of a silicon-containing material such as silicon, quartz, or silicon carbide. The focus ring FR is disposed to surround an edge of the substrate W. A heater HTF (e.g., resistance heating element) may be provided in the focus ring FR. The heater HTF generates heat by power supplied from the heater controller HCF. A high frequency filter FTF may be provided between the heater HTF and the heater controller HCF to prevent the high frequency power from flowing into the heater controller HCF.

A tubular member 26 extends upward from the bottom portion of the chamber body 12. The tubular member 26 extends along an outer periphery of the supporting part 15. The tubular member 26 is made of a conductor and has a substantially cylindrical shape. The tubular member 26 is connected to the ground potential. A corrosion resistant film may be formed on a surface of the tubular member 26. The corrosion resistant film may be a film formed by anodic oxidation treatment, or a ceramic film made of yttrium oxide.

An insulating member 28 is provided on the tubular member 26. The insulating member 28 has an insulating property and is made of ceramic such as quartz. The insulating member 28 has a substantially cylindrical shape and extends along the outer peripheries of the electrode plate 21, the lower electrode 18, and the electrostatic chuck 20. The edge portion of the baffle plate 14$b$ may be provided between the tubular member 26 and the insulating member 28 and may be clamped by the tubular member 26 and the insulating member 28.

The plasma processing apparatus 10 further includes a driving mechanism 29. The driving mechanism 29 is configured to raise and lower the focus ring FR. The driving mechanism 29 includes one or more driving units 29$u$. In the illustrated example, the driving mechanism 29 includes two driving units 29$u$.

Each of the driving units 29$u$ includes a rod 29$a$, a lifter 29$b$, and a driving device 29$c$. The rod 29$a$ has a columnar shape and extends in a vertical direction. The rod 29$a$ supports the focus ring FR. For example, the tip of the rod 29$a$ is connected to the bottom surface of the focus ring FR. In the inner space S, the rod 29$a$ extends through a through-hole penetrating through the insulating member 28 and the tubular member 26, for example. A power supply line for the heater HTF extends within the rod 29$a$ in the inner space S and extends to the outside of the chamber 11. The power supply line for the heater HTF is connected to the heater controller HCF via the high frequency filter FTF.

The driving device 29$c$ raises and lowers the rod 29$a$ via the lifter 29$b$. The driving device 29$c$ is, e.g., a stepping motor. The driving mechanism 29 further includes a power supply system 29$d$. The power supply system 29$d$ is configured to supply a pulse current to the driving device 29$c$. When the pulse current is supplied from the power supply system 29$d$ to the driving unit 29$c$, the focus ring FR is raised or lowered via the rod 29$a$.

The plasma processing apparatus 10 further includes an upper electrode 30. The upper electrode 30 is provided above the supporting table 16. The upper electrode 30 blocks an upper opening of the chamber body 12 in cooperation with a member 32. The member 32 has an insulating property. The upper electrode 30 is held on an upper portion of the chamber body 12 through the member 32.

The upper electrode 30 includes a ceiling plate 34 and a holder 36. A bottom surface of the ceiling plate 34 defines the inner space S (or the first space S1). The ceiling plate 34 is provided with a plurality of gas injection holes 34$a$. The gas injection holes 34$a$ penetrate through the ceiling plate 34 in a plate thickness direction (vertical direction). The ceiling plate 34 is made of, e.g., silicon, but is not limited thereto. Alternatively, the ceiling plate 34 may have a structure in which a corrosion resistant film is formed on a surface of a base material. The corrosion resistant film may be a film formed by anodic oxidation treatment or a ceramic film made of yttrium oxide. The base material is a conductive material, e.g., aluminum.

The holder 36 detachably holds the ceiling plate 34. The holder 36 may be made of a conductive material, e.g., aluminum. A gas diffusion space 36a is formed inside the holder 36. A plurality of gas holes 36b extends downward from the gas diffusion space 36a. The gas holes 36b communicate with the respective gas injection holes 34a. A gas inlet port 36c is formed in the holder 36 and is connected to the gas diffusion space 36a. A gas supply line 38 is connected to the gas inlet port 36c.

A gas supply unit 40 is connected to the gas supply line 38. The gas supply unit 40 and a gas supply unit 42 to be described later constitute a gas supply system. The gas supply system is connected to the first space S1. The gas supply unit 40 includes a gas source group 40s, a valve group 40a, a flow rate controller group 40b, and a valve group 40c.

The gas source group 40s includes a plurality of gas sources. The gas sources include a plurality of gas sources used in the method MT. The gas sources of the gas source group 40s include a source of one of a first gas and a second gas for forming an organic film to be described later. Further, the gas sources include one or more gas sources used for plasma processing of the substrate W. The gas sources may include an inert gas source used for a purge process to be described later.

Each of the valve group 40a and the valve group 40c includes a plurality of valves. The flow rate controller group 40b includes a plurality of flow rate controllers. Each of the flow rate controllers of the flow rate controller group 40b is a mass flow controller or a pressure control type flow controller. The gas sources of the gas source group 40s are respectively connected to the gas supply line 38 through corresponding valves of the valve group 40a, corresponding flow controllers of the flow rate control group 40b, and corresponding valves of the valve group 40c. The gas from the gas supply unit 40 is supplied into the first space S1 via the gas supply line 38, the gas diffusion space 36a, the gas holes 36b, and the gas injection holes 34a.

The plasma processing apparatus 10 further includes a gas supply unit 42. The gas supply unit 42 includes a gas source 42s, a valve 42a, a flow rate controller 42b, and a valve 42c. The gas source 42s is the source of the other one of the first gas and the second gas. The flow rate controller 42b is a mass flow controller or a pressure control type flow controller. The gas source 42s is connected to the first space S1 via the valve 42a, the flow rate controller 42b, and the valve 42c. The gas from the gas supply unit 42 is supplied into the first space S1.

A gas exhaust line 50 is connected to the bottom portion of the chamber body 12 of the plasma processing apparatus 10. A gas exhaust unit 52 is connected to the gas exhaust line 50. The gas exhaust unit 52 is connected to the second space S2 via the gas exhaust line 50. The gas exhaust unit 52 is also connected to the first space S1 via the second space S2 and the through-holes of the partition wall 14. The gas exhaust unit 52 includes a pressure control valve and a depressurization pump. The depressurization pump is connected to the second space S2 via a pressure control valve. The depressurization pump may be a turbo molecular pump and/or a dry pump.

The plasma processing apparatus 10 can generate plasma of the gas supplied into the first space S1 in the first space S1. The plasma processing apparatus 10 further includes a first high frequency power supply 61. The first high frequency power supply 61 generates a first high frequency power for plasma generation. The first high frequency power has a frequency within a range of 27 MHz to 100 MHz, for example. The first high frequency power supply 61 is connected to the upper electrode 30 via a matching unit 63. The matching unit 63 has a matching circuit for matching an output impedance of the first high frequency power supply 61 and an input impedance of a load side (the upper electrode 30 side). The first high frequency power supply 61 may be connected to the lower electrode 18 via the matching unit 63. In that case, the upper electrode 30 is electrically grounded.

The plasma processing apparatus 10 may further include a second high frequency power supply 62. The second high frequency power supply 62 generates a second high frequency power (for bias) for attracting ions to the substrate W. The frequency of the second high frequency is lower than the frequency of the first high frequency. The frequency of the second high frequency is within a range of 400 kHz to 13.56 MHz, for example. The second high frequency power supply 62 is connected to the lower electrode 18 via a matching unit 64. The matching unit 64 has a matching circuit for matching an output impedance of the second high frequency power supply 62 and an input impedance of a load side (the lower electrode 18 side).

In the plasma processing apparatus 10, when the first high frequency power is supplied in a state in which a gas is supplied into the first space S1, the gas is excited and plasma is generated in the first space S1. When the second high frequency power is supplied to the lower electrode 18, ions in the plasma are accelerated toward the substrate W.

The plasma processing apparatus 10 further includes a DC power supply 70. The DC power supply 70 is connected to the upper electrode 30. The DC power supply 70 is configured to apply a negative DC voltage to the upper electrode 30. When the negative DC voltage is applied to the upper electrode 30, positive ions in the plasma generated in the first space S1 collide with the ceiling plate 34 of the upper electrode 30. When the positive ions collide with the ceiling plate 34, secondary electrons are emitted from the ceiling plate 34. In the case where the ceiling plate 34 is made of silicon, when the positive ions collide with the ceiling plate 34, silicon can be released from the ceiling plate 34.

In one embodiment, the plasma processing apparatus 10 may further include a control unit 80. The control unit 80 is configured to control the respective components of the plasma processing apparatus 10. The control unit 80 may be a computer including a processor, a storage device such as and a memory, an input device, a display device, and the like. The control unit 80 executes a control program stored in the storage device and controls the respective components of the plasma processing apparatus 10 based on a recipe data stored in the storage device. Accordingly, the plasma processing apparatus 10 executes a process specified by the recipe data. For example, the control unit 80 controls the respective components of the plasma processing apparatus 10 in executing the method MT, and performs various processes to be described later, such as calculation, determinations, and the like. Various data used for executing the method MT are stored in the storage device of the control unit 80.

Hereinafter, the method MT will be described in detail with reference to FIG. 1. In the following description, the case in which the method MT is performed by using the plasma processing apparatus 10 will be described as an example. Further, in the following description, FIGS. 3 to 7 will be referred to. FIGS. 3 to 7 show exemplary relations between the state of the focus ring and the incidence direction of ions. In FIGS. 3 to 7, circles indicate ions.

In the method MT, the substrate W is mounted on the supporting table 16 (electrostatic chuck 20). Then, plasma processing P(1) is performed on the substrate W in a first step STP(1). "P(i)" indicates plasma processing in an $i^{th}$ step STP(i) in the method MT. "i" is an integer of 1 or more.

The conditions of the plasma processing P(i) are specified by the recipe data stored in the storage device of the control unit 80. During the execution of the step STP(i), the shutter SH blocks the opening of the partition wall 14. In the step STP(i), the processing gas for the plasma processing P(i) is supplied to the inner space S (the first space S1). In the step STP(i), the gas exhaust unit 52 is controlled to set a pressure in the inner space S to a pressure for the plasma processing P(i). In the step STP(i), the first high frequency power is supplied. The power level of the first high frequency power is set to the power level specified for the plasma processing P(i). In the step STP(i), the second high frequency power may be further supplied. The power level of the second radio frequency power is set to the power level specified for the plasma processing P(i). As a result, in the step STP(i), plasma of the processing gas is generated. The substrate W is treated with ions from the plasma. For example, the substrate W is etched by ions from the plasma.

Figure 3:
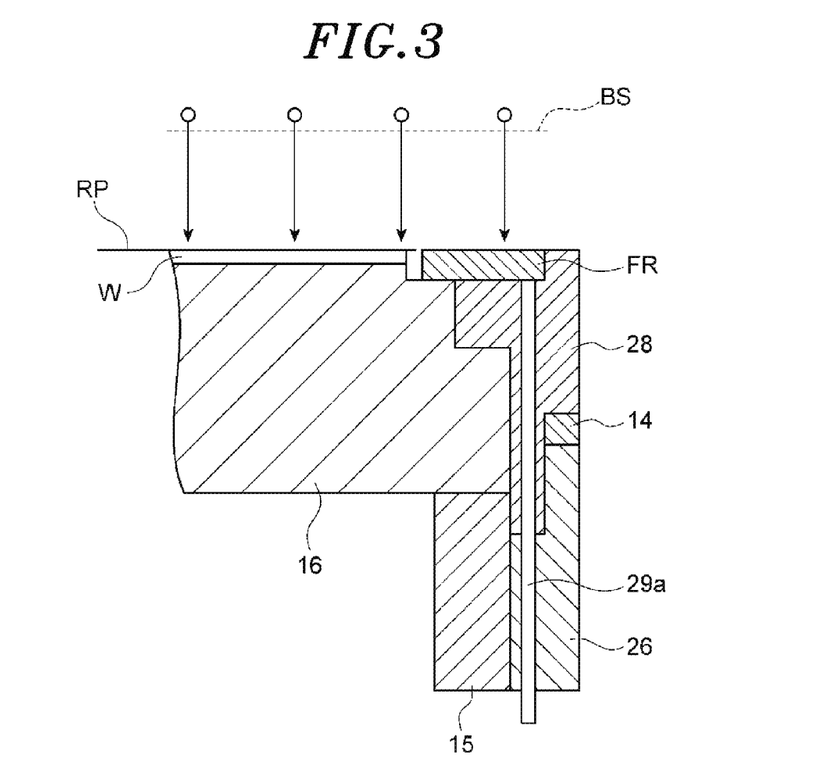
FIGS. 3 to 7 show exemplary relations between a state of a focus ring and an incidence direction of ions.

As shown in FIG. 3, a new focus ring FR is used and the first plasma processing P(i), i.e., the plasma processing P(1), is executed. In that case, the position of the upper surface of the focus ring FR in the vertical direction coincides with a reference position RP. When the position of the upper surface of the focus ring in the vertical direction coincides with the reference position RP, the interface between the sheath and the plasma has a shape in which ions from the plasma are vertically incident on the entire upper surface of the substrate W. For example, the interface BS between the sheath and the plasma has a substantially flat shape from a position above the center of the substrate to a position above the focus ring FR. In the case where the plasma processing is plasma etching, when ions from the plasma are vertically incident on the entire upper surface of the substrate W, a plurality of openings extending in the vertical direction is formed in the entire substrate W. The reference position RP may be, e.g., a position in the vertical direction of the upper surface of the substrate W mounted on the supporting table 16. The reference position RP may be any position as long as ions are vertically incident on the entire substrate W.

Figure 4:
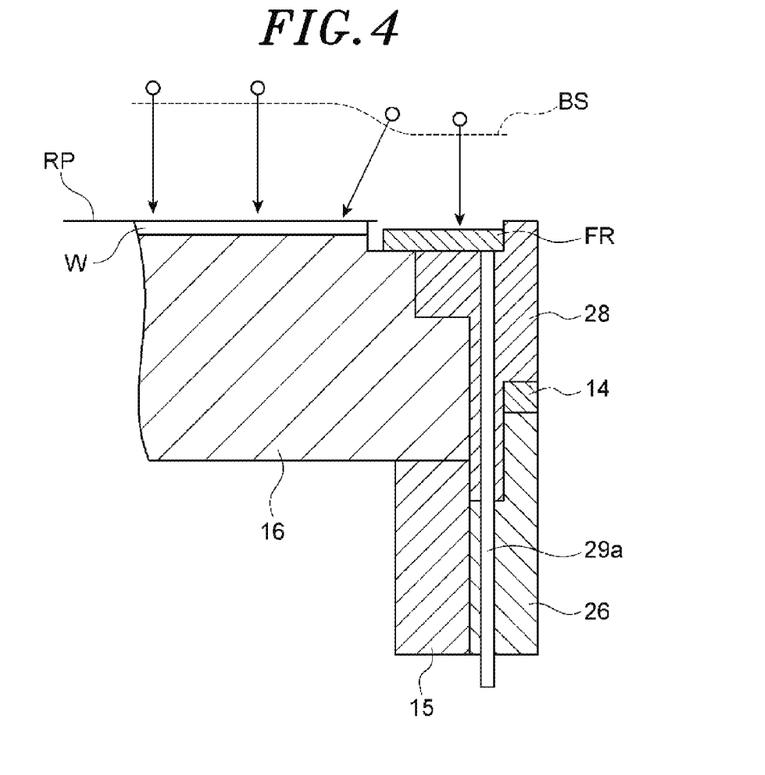

The focus ring FR is etched by the plasma processing P(i) of the step STP(i). In other words, the focus ring FR is consumed by the plasma processing P(i) of the step STP(i), and the thickness of the focus ring FR decreases. When the thickness of the focus ring FR decreases, a difference occurs between the position of the upper surface of the focus ring FR in the vertical direction and the reference position RP. When the difference occurs between the position of the upper surface of the focus ring FR in the vertical direction and the reference position RP, the shape of the interface BS is deformed in the region above the edge of the substrate W as shown in FIG. 4. As a result, ions from the plasma are obliquely incident on the edge of the substrate W. In the case where the plasma processing is plasma etching, when ions from the plasma are obliquely incident on the edge of the substrate W, an opening is formed obliquely at the edge of the substrate W.

In the method MT, a step ST13 may be executed to reduce the difference between the reference position RP and the position of the upper surface of the focus ring FR in the vertical direction. In the step ST13, an organic film OF is selectively formed on the focus ring FR. After the execution of the step ST13, the plasma processing P(i) is executed in the step STP(i).

Referring back to FIG. 1, in the method MT, a step ST1 is executed before the execution of the plasma processing P(i) in second and subsequent steps STP(i). In the step ST1, a film thickness $F_{OF\_L}$ of a remaining organic film OF on the focus ring FR after the execution of plasma processing P(i-1) is calculated by the control unit 80 according to the Eq. (1).

$$F_{OF\_L} = F_{OF\_CUR} - T_P(i-1) \times E_{P\_OF}(P(i-1))$$ Eq. (1)

The plasma processing P(i-1) is plasma processing in an $(i-1)^{th}$ step STP(i-1).

In the Eq. (1), $F_{OF\_CUR}$ indicates a film thickness of the organic film OF formed immediately before the plasma processing P(i-1). $T_P(j)$ indicates the duration of the plasma processing P(j) in a $j^{th}$ step STP(j). Therefore, $T_P(i-1)$ in the Eq. (1) indicates the duration of the plasma processing P(i-1). $E_{P\_OF}(P(j))$ indicates an etching rate of the organic film OF by the plasma processing P(j). Therefore, $E_{P\_OF}(P(i-1))$ in the Eq. (1) indicates an etching rate of the organic film OF by the plasma processing P(i-1). The duration $T_P(j)$ and the etching rate $E_{P\_OF}(P(j))$ are registered in the storage device of the control unit 80. The lower limit of the film thickness $F_{OF\_L}$ is 0. For example, in the step ST1 executed immediately before the plasma processing P(2), the organic film OF is not yet formed and, thus, the film thickness $F_{OF\_L}$ is 0.

In a subsequent step ST2, it is determined whether or not the organic film OF remains. In other words, in the step ST2, it is determined whether or not the film thickness $F_{OF\_L}$ is greater than 0. When the film thickness $F_{OF\_L}$ is 0, the processing proceeds to a step ST4. On the other hand, when the film thickness $F_{OF\_L}$ is greater than 0, a step ST3 is executed.

In the step ST3, the remaining organic film OF is removed. During the execution of the step ST3, the shutter SH blocks the opening of the partition wall 14. In one embodiment, the organic film OF is removed by plasma etching. In order to perform the plasma etching, plasma of a removal gas is generated in the first space S1. The removal gas may include an oxygen-containing gas. The oxygen-containing gas may be oxygen gas ($O_2$ gas), CO gas, or $CO_2$ gas. Alternatively, the removal gas may include a gaseous mixture of hydrogen gas ($H_2$ gas) and nitrogen gas ($N_2$ gas). In another embodiment, the focus ring FR may be heated by the heater HTF to depolymerize the organic film OF. The gas of the organic compound produced by the depolymerization is exhausted. After the remaining organic film OF is removed in the step ST3, a step ST4 is executed.

The duration of the plasma etching in the step ST3 is $T_{REM}$, which is calculated by the following Eq. (2).

$$T_{REM} = F_{OF\_L}/E_{REM\_OF} \times M$$ Eq. (2)

In the Eq. (2), $E_{REM\_OF}$ indicates an etching rate of the organic film OF in the plasma etching of the step ST3, and is registered in the storage device of the control unit 80. In the Eq. (2), M is a numerical value registered in the storage device of the control unit 80, and is greater than 1. Therefore, the duration $T_{REM}$ includes duration of overetching defined by the following Eq. (3).

$$T_{OE} = F_{OF\_L}/E_{REM\_OF} \times (M-1)$$ Eq. (3)

In the step ST4, the control unit 80 calculates the reduction amount $D_{CUR}$ of the thickness of the focus ring FR. The reduction amount $D_{CUR}$ is calculated by the following Eq. (4).

$$D_{CUR} = T_{FR\_ETCH} \times E_{P\_FR}(P(i-1)) + T_{OE} \times E_{OE\_FR}$$ Eq. (4)

$E_{P\_FR}(P(j))$ indicates an etching rate of the focus ring by the plasma processing $P(j)$ and registered in the storage device of the control unit 80. $E_{P\_FR}(P(i-1))$ in the Eq. (4) indicates an etching rate of the focus ring by the plasma processing $P(i-1)$. In the Eq. (4), $E_{OE\_FR}$ Indicates an etching rate of the focus ring FR by the overetching in the step ST3, and is registered in the storage device of the control unit 80. In the Eq. (4), $T_{FR\_ETCH}$ indicates duration of time from when the organic film OF on the focus ring FR disappears in the plasma processing $P(i-1)$ to when the plasma processing $P(i-1)$ is completed. The duration $T_{FR\_ETCH}$ is calculated by the following Eq. (5).

$$T_{FR\_ETCH}=T_P(i-1)-F_{OF\_CUR}/E_{P\_OF}(P(i-1)) \quad \text{Eq. (5)}$$

In a step ST5 subsequent to the step ST4, an accumulated amount_$D_{ACM}$ of the reduction amount $D_{CUR}$ is calculated by the control unit 80. The accumulated amount $D_{ACM}$ is calculated by the following Eq. (6).

$$D_{ACM}=D_{ACM}+D_{CUR} \quad \text{Eq. (6)}$$

In a subsequent step ST6, a target correction amount $C_T$ is calculated by the control unit 80. The target correction amount $C_T$ reflects the difference between the position of the upper surface of the focus ring FR in the vertical direction and the reference position RP. The target correction amount $C_T$ is calculated by the following Eq. (7).

$$C_T=D_{ACM}-U_{ACM} \quad \text{Eq. (7)}$$

In the Eq. (7), $U_{ACM}$ is an accumulated amount of an amount (distance) of upward movement of the focus ring FR from an initial position of the focus ring FR.

In a subsequent step ST7, it is determined whether or not the accumulated amount $D_{ACM}$ of the reduction amount of the thickness of the focus ring FR is greater than a reference value $R_{TH}$. The reference value $R_{TH}$ is registered in the storage device of the control unit 80. When the accumulated amount $D_{ACM}$ is greater than the reference value $R_{TH}$, the focus ring FR is exchanged with a new focus ring FR in a step ST8, and the processing proceeds to a step STP(i). On the other hand, when the accumulated amount $D_{ACM}$ is smaller than or equal to the reference value $R_{TH}$, the processing proceeds to a step ST9.

In the step ST9, it is determined whether or not the target correction amount $C_T$ is greater than or equal to a minimum movement control amount $U_{MIN}$. The minimum movement control amount $U_{MIN}$ is registered in the storage device of the control unit 80. The driving mechanism 29 can raise the focus ring FR with the minimum movement control amount $U_{MIN}$ as a minimum distance. In other words, the driving mechanism 29 can raise the focus ring FR by a distance that is an integer multiple of the minimum movement control amount $U_{MIN}$. When the target correction amount $C_T$ is smaller than the minimum movement control amount $U_{MIN}$, the processing proceeds to a step ST11. When the target correction amount $C_T$ is greater than or equal to the minimum movement control amount $U_{MIN}$, the driving mechanism 29 is controlled to raise the focus ring FR in a step ST10. The driving mechanism 29 raises the focus ring FR by a maximum movement amount $U_{CUR}$ smaller than or equal to the target correction amount $C_T$. The accumulated amount $U_{ACM}$ is updated using the maximum movement amount $U_{CUR}$. Specifically, the control unit 80 performs the calculation of the following Eq. (8).

$$U_{ACM}=U_{ACM}+U_{CUR} \quad \text{Eq. (8)}$$

Thereafter, a step ST11 is executed.

In the step ST11, a target film formation amount $F_T$ is calculated by the control unit 80. The target film formation amount $F_T$ is calculated by the following Eq. (9).

$$F_T=C_T-U_{CUR} \quad \text{Eq. (9)}$$

In a subsequent step ST12, it is determined whether or not the target film formation amount $F_T$ is greater than or equal to a minimum film formation control amount $F_{MIN}$. The minimum film formation control amount $F_{MIN}$ is registered in the storage device of the control unit 80. The minimum film formation control amount $F_{MIN}$ may be smaller than the minimum movement control amount $U_{MIN}$. In a step ST13 to be described later, it is possible to form the organic film OF with the minimum film formation control amount $F_{MIN}$ as a minimum thickness. In other words, in the step ST13, it is possible to form the organic film OF with a thickness that is an integral multiple of the minimum film formation control amount $F_{MIN}$. When the target film formation amount $F_T$ is smaller than the minimum film formation control amount $F_{MIN}$, the processing proceeds to the step STP(i). On the other hand, when the target film formation amount $F_T$ is greater than or equal to the minimum film formation control amount $F_{MIN}$, the step ST13 is executed.

In the step ST13, the organic film OF is formed on the focus ring FR to reduce the amount obtained by subtracting the maximum movement amount $U_{CUR}$ from the target correction amount $C_T$. In the step ST13, the organic film OF is formed with a maximum thickness smaller than or equal to $(C_T-U_{CUR})$, i.e., smaller than or equal to the target film formation amount $F_T$ and greater than or equal to the minimum film formation control amount $F_{MIN}$.

In the step ST13 of one embodiment, the first gas and the second gas are alternately or simultaneously supplied to the first space S1 to form the organic film OF. The first gas and the second gas are also supplied to the second space S2 via the first space S1. One of the first gas and the second gas is supplied by the gas supply unit 40. The other of the first gas and the second gas is supplied by the gas supply unit 42. In the step ST13, the gas exhaust unit 52 is controlled to set a pressure in the inner space S is to a specified pressure. In the step ST13, plasma is not generated in the inner space S.

In the case where the first gas and the second gas are alternately supplied to the first space S1 in the step ST13, the inner space S may be purged after the supply of the first gas and before the supply of the second gas. In the case where the first gas and the second gas are alternately supplied to the first space S1 in the step ST13, the inner space S may be purged after the supply of the second gas and before the supply of the first gas. When the inner space S is purged, the gas in the inner space S is exhausted by the gas exhaust unit 52. In addition, when the inner space S is purged, an inert gas may be supplied from the gas supply unit 40 to the inner space. The inert gas is, e.g., rare gas or nitrogen gas.

The first gas contains a first organic compound. The second gas contains a second organic compound. The organic film OF is formed by polymerization of the first organic compound and the second organic compound. The polymerization of the first organic compound and the second organic compound occurs within a first temperature range of 0° C. to 150° C., for example. In other words, the polymerization of the first organic compound and the second organic compound does not occur within a second temperature range lower than a lower limit temperature of the first temperature range. The polymerization of the first organic compound and the second organic compound does not occur within a third temperature range higher than an upper limit temperature of the first temperature range. The third temperature range is higher than or equal to 250° C. and lower than or equal to 400° C., for example. The organic compound formed by the polymerization of the first organic compound and the second organic compound may be depolymerized to the first organic compound and the second organic compound within the third temperature range.

In the step ST13 of one embodiment, the focus ring FR is heated by the heater FTH to a temperature within the first temperature range. The contact area between the focus ring FR and its surrounding component (e.g., the supporting table 16) is small. Therefore, the focus ring FR is thermally separated from its surrounding component. Accordingly, the focus ring FR is selectively heated, and polymerization occurs selectively on the focus ring FR. As a result, the organic film OF is selectively formed on the focus ring FR.

Hereinafter, examples of the first organic compound and the second organic compound, and the organic compound produced by the polymerization of the first organic compound and the second organic compound, i.e., the organic compound forming the organic film OF, will be described.

The first organic compound may be isocyanate shown in the following formula (1) or (2), and the second organic compound may be amine shown in the following formula (3) or (4). In other words, the first organic compound may be monofunctional isocyanate or difunctional isocyanate, and the second organic compound may be monofunctional amine or difunctional amine.

(Formula 1)

(1)

(Formula 2)

(2)

(Formula 3)

(3)

(Formula 4)

(4)

In the formulas (1) and (2), R represents a saturated hydrocarbon group such as an alkyl group (linear alkyl group or cyclic alkyl group), an unsaturated hydrocarbon group such as an aryl group or the like, or a group containing a heteroatom such as N, O, S, F, Si or the like. The group containing the heteroatom includes an unsaturated hydrocarbon group or a saturated hydrocarbon group whose elements are partially substituted with N, O, S, F, Si, or the like. As for the isocyanate that is the first compound, an aliphatic compound or an aromatic compound can be used, for example. As for the aliphatic compound, an aliphatic chain compound or an aliphatic cyclic compound can be used. The aliphatic compound may include, e.g., hexamethylene diisocyanate. The aliphatic cyclic compound may include, e.g., 1,3-bis (isocyanatomethyl) cyclohexane (H6XDI).

In the formulas (3) and (4), R represents a saturated hydrocarbon group such as an alkyl group (linear alkyl group or a cyclic alkyl group) or the like, an unsaturated hydrocarbon group such as an aryl group or the like, or a group containing a heteroatom such as N, O, S, F, Si or the like. The group containing the heteroatom includes an unsaturated hydrocarbon group or a saturated hydrocarbon group whose elements are partially substituted with N, O, S, F, Si, or the like. The atomic group represented by R in the formulas (1) and (2) may be the same as or different from the atomic group represented by R in the formulas (3) and (4). As for the amine that is the second organic compound, an aliphatic compound or an aromatic compound can be used, for example. As for the aliphatic compound, an aliphatic chain compound or an aliphatic cyclic compound can be used. The aliphatic compound may include, e.g., 1,12-diaminododecane (DAD). The aliphatic cyclic compound may include 1,3-bis (aminomethyl) cyclohexane (H6XDA). The amine that is the second organic compound may be secondary amine.

As for the organic compound obtained by polymerization of isocyanate and amine (addition condensation), compounds having a urea bond shown in the following formulas (5) to (8) may be used. The compound shown in the formula (5) is produced by polymerization of the compound shown in the formula (1) and the compound shown in the formula (3). The compound shown in the formula (6) is produced by polymerization of the compound shown in the formula (1) and the compound shown in the formula (4). Alternatively, the compound shown in the formula (6) is produced by polymerization of the compound shown in the formula (2) and the compound shown in the formula (3). The compound shown in the formula (7) is produced by polymerization of the compound shown in the formula (2) and the compound shown in the formula (4). The compound shown in the formula (8) has a structure in which both ends of the polymer shown in the formula (7) are terminated with a monomer having an isocyanate group (e.g., the compound shown in the formula (1)) and a monomer having an amino group (e.g., the compound shown in the formula (3)). In the formulas (7) and (8), n is an integer of 2 or more.

(Formula 5)

(5)

(Formula 6)

(6)

(Formula 7)

(7)

(Formula 8)

(8)

In another example, the first organic compound may be isocyanate shown in the formula (1) or (2), and the second organic compound may be a compound having a hydroxyl group shown in the following formula (9) or (10). In other words, the first organic compound may be monofunctional isocyanate or difunctional isocyanate, and the second organic compound may be a monofunctional compound having a hydroxyl group or a difunctional compound having a hydroxyl group.

(Formula 9)

(9)

(Formula 10)

(10)

In the formulas (9) and (10), R represents a saturated hydrocarbon group such as an alkyl group (linear alkyl group or cyclic alkyl group) or the like, an unsaturated hydrocarbon group such as an aryl group or the like, or a group containing a heteroatom such as N, O, S, F, Si or the like. The group containing the heteroatom includes an unsaturated hydrocarbon group or a saturated hydrocarbon group whose elements are partially substituted with N, O, S, F, Si, or the like. The atomic group represented by R in the formulas (1) and (2) may be the same as or different from the atomic group represented by R in the formulas (9) and (10). The compound having a hydroxyl group is alcohol or phenol. As for the alcohol that is the second organic compound, ethylene glycol can be used, for example. As for the phenol that is the second organic compound, hydroquinone can be used, for example.

As for another organic compound obtained by polymerization (poly addition) of isocyanate and a compound having a hydroxyl group, compounds having a urethane bond shown in the following formulas (11) to (15) can be used. The compound shown in the formula (11) is produced by polymerization of the compound shown in the formula (1) and the compound shown in the formula (9). The compound shown in the formula (12) is produced by polymerization of the compound shown in the formula (1) and the compound shown in the formula (10). The compound shown in the formula (13) is produced by polymerization of the compound shown in the formula (2) and the compound shown in the formula (9). The compound shown in the formula (14) is produced by polymerization of the compound shown in the formula (2) and the compound shown in the formula (10). The compound shown in the formula (15) has a structure in which both ends of the polymer shown in the formula (14) are terminated with a monomer having an isocyanate group (e.g., the compound shown in the formula (1)) and a monomer having a hydroxyl group (e.g., the compound shown in the formula (9)). In the formulas (14) and (15), n is an integer of 2 or more.

(Formula 11)

(11)

(Formula 12)

(12)

(Formula 13)

(13)

(Formula 14)

(14)

-continued (Formula 15)

(15)

In still another example, the first organic compound may be carboxylic acid shown in the following formula (16) or (17), and the second organic compound may be amine shown in the formula (3) or (4). In other words, the first organic compound can be monofunctional carboxylic acid or difunctional carboxylic acid, and the second organic compound can be monofunctional amine or difunctional amine.

(Formula 16)

(16)

(Formula 17)

(17)

In the formulas (16) and (17), R represents a saturated hydrocarbon group such as an alkyl group (a linear alkyl group or a cyclic alkyl group), an unsaturated hydrocarbon group such as an aryl group, or an unsaturated hydrocarbon group such as N, O, S, F, or a group containing a heteroatom such as Si. The group containing the heteroatom is an unsaturated hydrocarbon group or a saturated hydrocarbon group in which some of the elements are substituted with N, O, S, F, Si, or the like. The atomic group represented by R in the formulas (3) and (4) may be the same as or different from the atomic group represented by R in the formulas (16) and (17). The carboxylic acid which is the first organic compound may be, e.g., terephthalic acid.

As for the organic compound obtained by polymerization (poly condensation) of carboxyl acid and amine, compounds having an amide bond shown in the following formulas (18) to (22), e.g., polyamide, can be used. The compound shown in the formula (18) is produced by polymerization of the compound shown in the formula (16) and the compound shown in the formula (3). The compound shown in the formula (19) is produced by polymerization of the compound shown in the formula (16) and the compound shown in the formula (4). The compound shown in the formula (20) is produced by polymerization of the compound shown in the formula (17) and the compound shown in the formula (3). The compound shown in the formula (21) is produced by polymerization of the compound shown in the formula (17) and the compound shown in the formula (4). The compound shown in the formula (22) has a structure in which both ends of the polymer shown in the formula (21) are terminated with a monomer having a carboxyl group (e.g., the compound shown in the formula (16)) and a monomer having an amino group (e.g., the compound shown in the formula (3)). In the formulas (21) and (22), n is an integer of 2 or more. The polymerization reaction of carboxylic acid and amine produces water molecules. The produced water molecules are exhausted from the processing space under a depressurized environment. Therefore, the polymerization reaction of carboxylic acid and amine is irreversible.

(Formula 18)

(18)

(Formula 19)

(19)

(Formula 20)

(20)

(Formula 21)

(21)

(Formula 22)

(22)

The first organic compound used for polymerization with the amine shown in the formula (3) or (4) may be carboxylic acid halide shown in the following formula (23). In the formula (23), X is F, Cl, Br, or I. The atomic group represented by R in the formula (23) may be the same as or different from the atomic group represented by R in the formulas (16) and (17).

(Formula 23)

(23)

In still another example, the first organic compound may be carboxylic acid shown in the formula (16) or (17), and the second organic compound may be a compound having a hydroxyl group shown in the formula (9) or (10). In other words, the first organic compound may be monofunctional carboxylic acid or difunctional carboxylic acid, and the second organic compound may be a monofunctional compound having a hydroxyl group or a difunctional compound having a hydroxyl group. The atomic group represented by R in formulas (16) and (17) may be the same as or different from the atomic group represented by R in formulas (9) and (10)

As for the organic compound obtained by polymerization (poly condensation) of carboxylic acid and a compound having a hydroxyl group, a compound having an ester bond shown in the following formulas (24) to (28), e.g., polyester, can be used. The compound shown in the formula (24) is produced by polymerization of the compound shown in the formula (16) and the compound shown in the formula (9). The compound shown in the formula (25) is produced by polymerization of the compound shown in the formula (16) and the compound shown in the formula (10). The compound shown in the formula (26) is produced by polymerization of the compound shown in the formula (17) and the compound shown in the formula (9). The compound shown in the formula (27) is produced by polymerization of a compound shown in the formula (17) and a compound shown in the formula (10). The compound shown in the formula (28) has a structure in which both ends of the polymer shown in the formula (27) are terminated with a monomer having a carboxyl group (e.g., the compound shown in the formula (16)) and a monomer having a hydroxyl group (e.g., the compound shown in the formula (9)). In the formulas (27) and (28), n is an integer of 2 or more. The polymerization reaction of the carboxylic acid and the compound having a hydroxyl group produces water molecules. The produced water molecules are exhausted from the processing space under a depressurized environment.

Therefore, the polymerization reaction of the carboxylic acid and the compound having a hydroxyl group is irreversible.

(Formula 24)

(24)

(Formula 25)

(25)

(Formula 26)

(26)

(Formula 27)

(27)

(Formula 28)

(28)

The first organic compound used for polymerization with the compound having a hydroxyl group shown in the formula (9) or (10) may be carboxylic acid halide shown in the above formula (23).

In still another example, the first organic compound may be carboxylic acid anhydride shown in the following formula (29) or (30), and the second organic compound may be amine shown in the formula (3) or (4).

(Formula 29)

(29)

(Formula 30)

(30)

In the formulas (29) and (30), R represents a saturated hydrocarbon group such as an alkyl group (linear alkyl group or cyclic alkyl group), an unsaturated hydrocarbon group such as an aryl group, or a group containing a heteroatom such as N, O, S, F, Si or the like. The group containing the heteroatom includes an unsaturated hydrocarbon group or a saturated hydrocarbon group whose elements are partially substituted with N, O, S, F, Si, or the like. The atomic group represented by R in formulas (29) and (30) may be the same as or different from the atomic group represented by R in formulas (3) and (4). The carboxylic acid anhydride that is the first organic compound may be, e.g., pyromellitic dianhydride.

The organic compound obtained by polymerization of carboxylic acid anhydride and amine may be, e.g., an imide compound shown in the following formula (31) or formula (32). The compound shown in the formula (31) is produced by polymerization of the compound shown in the formula (29) and the compound shown in the formula (3). The compound shown in the formula (32) is produced by polymerization of the compound shown in the formula (30) and the compound shown in the formula (4). In the formulas (31) and (32), n is an integer of 2 or more. The polymerization reaction of carboxylic anhydride and amine produces water molecules. The produced water molecules are exhausted from the processing space under a depressurized environment. Therefore, the polymerization reaction of carboxylic acid anhydride and amine is irreversible. In the polymerization of carboxylic anhydride and amine, monofunctional carboxylic anhydride, difunctional carboxylic anhydride, monofunctional amine, and difunctional amine may be used.

(Formula 31)

(31)

(Formula 32)

(32)

In the case where the organic film OF is made of an organic compound produced by polymerization of isocyanate as the first organic compound and amine as the second organic compound or an organic compound produced by polymerization of isocyanate and a compound having a hydroxyl group, the organic film OF can be removed by depolymerization in the step ST3. The focus ring FR is heated by the heater HTF to a temperature within the third temperature range to cause depolymerization.

Figure 5:
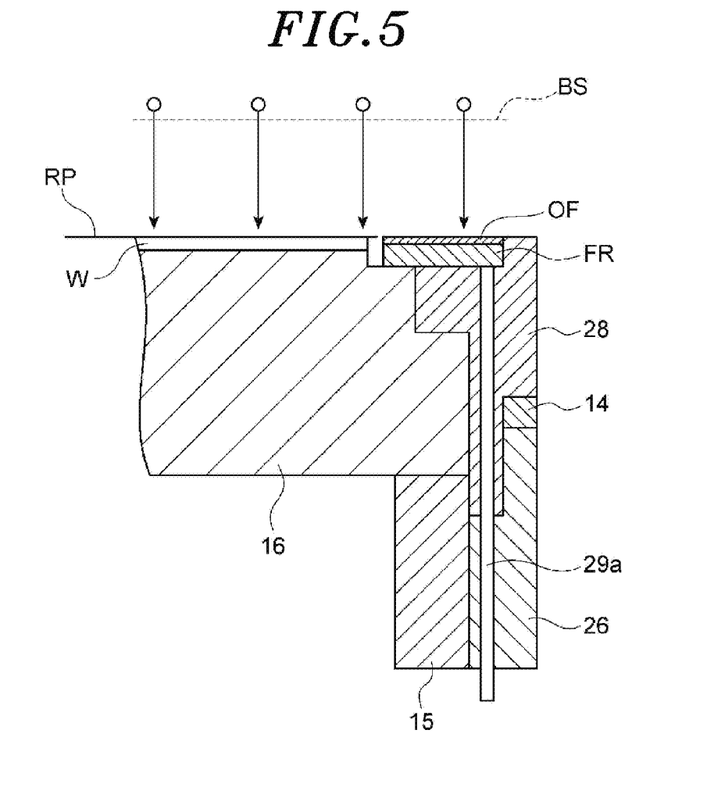
Figure 6:
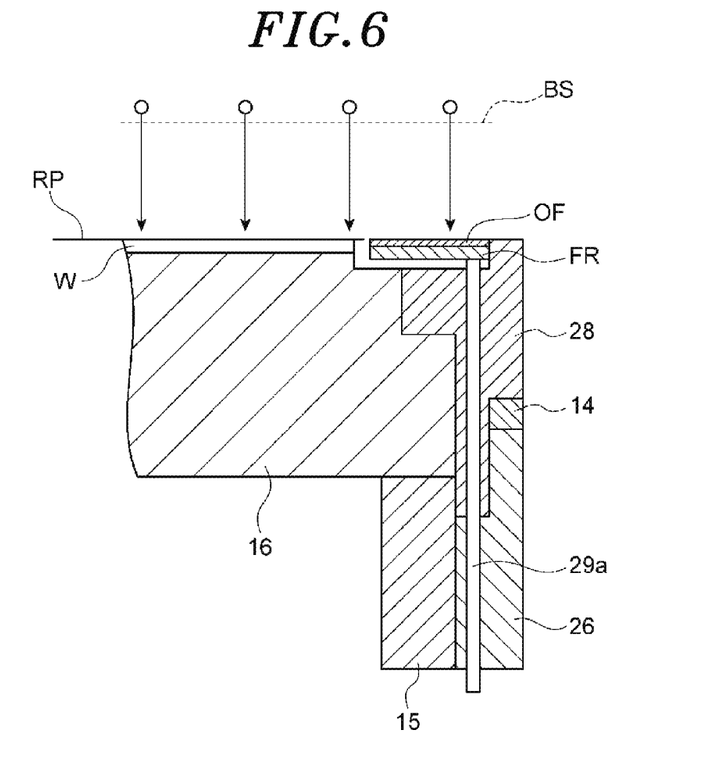

As shown in FIG. 1, in the method MT, the plasma processing P(i) of the step STP(i) is executed. When both of the step ST10 and the step ST13 are executed before the execution of the plasma processing P(i) or when only the step ST13 is executed among the steps ST10 and ST13, the difference between the position of the upper surface of the focus ring FR in the vertical direction and the reference position RP is reduced. Specifically, as shown in FIG. 5 or FIG. 6, the difference between the reference position RP and the position of the upper surface of the composite of the focus ring FR and the organic film OF in the vertical direction is reduced. Therefore, in the plasma processing P(i), the interface BS between the sheath and the plasma has a shape in which ions from the plasma are vertically incident on the entire upper surface of the substrate W.

Figure 7:
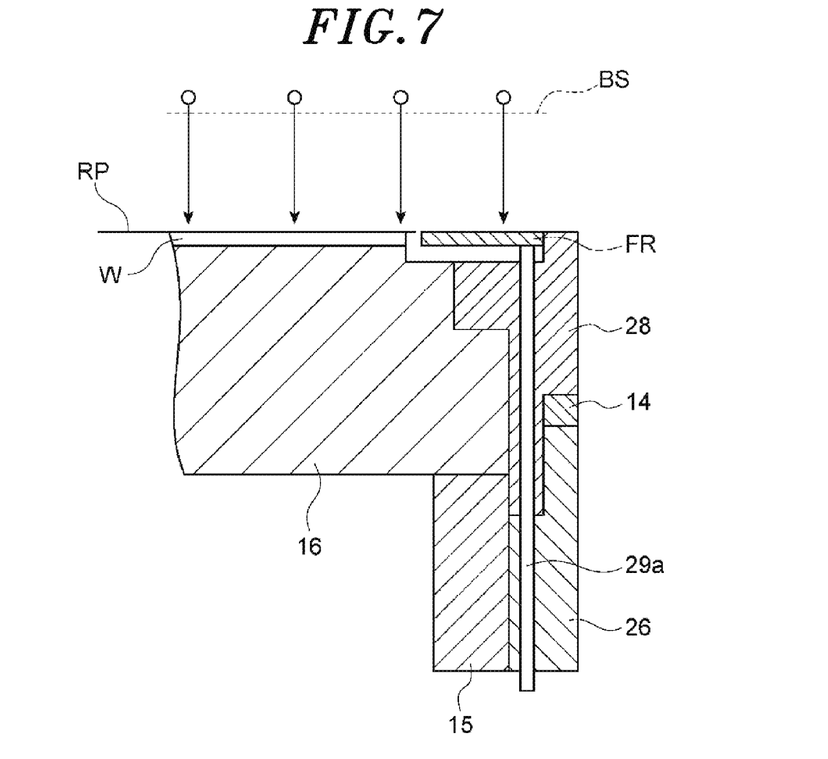

When only the step ST10 among the steps ST10 and ST13 is executed before the execution of the plasma processing P(i), as shown in FIG. 7, the difference between the position of the upper surface of the focus ring FR in the vertical direction and the reference position RP is reduced. Therefore, in the plasma processing P(i), the interface BS between the sheath and the plasma has a shape in which ions from the plasma are vertically incident on the entire upper surface of the substrate W.

Next, in a step ST14 subsequent to the step STP(i), it is determined whether or not the stop conditions are satisfied. It is determined that the stop conditions are satisfied when the number of executions of the step STP(i) has reached a predetermined number. If it is determined in step ST14 that the stop conditions are not satisfied, the processes from the step ST1 are repeated. In other words, in one embodiment, the steps ST13 and STP(i) are repeated. Or, the step STP(i) may be executed two or more times on the same substrate W. Or, the substrate may be exchanged between the step ST14 and the step ST1. On the other hand, if it is determined in the step ST14 that the stop conditions are satisfied, the execution of the method MT is terminated.

In the above-described method MT, the organic film OF is formed on the focus ring FR. The organic film OF is formed to reduce the difference between the position of the upper surface of the focus ring FR in the vertical direction and the reference position RP. The reference position RP is the position of the upper surface of the focus ring FR in the vertical direction which is defined to allow ions to be vertically incident on the edge of the substrate. In accordance with the method MT, the position of the upper surface of the focus ring FR is corrected by the organic film OF. Accordingly, even when the thickness of the focus ring FR decreases, oblique incidence of ions on the edge of the substrate W is suppressed.

While various embodiments have been described, various modifications can be made without being limited to the above-described embodiments. For example, the method MT may be performed by using a plasma processing apparatus other than the plasma processing apparatus 10. Such a plasma processing apparatus may be an inductively coupled plasma processing apparatus, or a plasma processing apparatus for generating plasma by a surface wave such as a microwave.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A plasma processing method performed in a state where a focus ring is disposed on a supporting table to surround an edge of a substrate by a plasma processing apparatus including a chamber and the supporting table provided in the chamber and configured to support the substrate mounted thereon, the method comprising:
   forming an organic film on the focus ring to reduce a difference between a position of an upper surface of the focus ring in a vertical direction and a reference position; and
   performing plasma processing on the substrate after the formation of the organic film,
   wherein in said forming the organic film, a first gas containing a first organic compound and a second gas containing a second organic compound are supplied to the chamber, and
   the organic film is formed by polymerization of the first organic compound and the second organic compound.

2. The plasma processing method of claim 1, wherein said forming the organic film and said performing plasma processing are repeated.

3. The plasma processing method of claim 2, wherein a heater is provided in the focus ring, and
   in said forming the organic film, the focus ring is heated by the heater so that a polymerization occurs selectively on the focus ring.

4. The plasma processing method of claim 1, wherein a heater is provided in the focus ring, and
   in said forming the organic film, the focus ring is heated by the heater so that a polymerization occurs selectively on the focus ring.

5. A plasma processing method performed in a state where a focus ring is disposed on a supporting table to surround an edge of a substrate by a plasma processing apparatus including a chamber and the supporting table provided in the chamber and configured to support the substrate mounted thereon, the method comprising:
   forming an organic film on the focus ring to reduce a difference between a position of an upper surface of the focus ring in a vertical direction and a reference position; and
   performing plasma processing on the substrate after the formation of the organic film,
   wherein the plasma processing apparatus further includes a driving mechanism configured to raise the focus ring, the method further comprising:
   when a target correction amount that reflects the difference is greater than or equal to a minimum movement control amount of the focus ring by the driving mechanism, raising the focus ring by using the driving mechanism by a maximum movement amount smaller than or equal to the target correction amount,
   wherein in said forming the organic film, the organic film is formed to reduce an amount obtained by subtracting the maximum movement amount from the target correction amount.

6. The plasma processing method of claim 5, wherein said forming the organic film and said performing plasma processing are repeated.

7. The plasma processing method of claim 6, wherein in said forming the organic film, a first gas containing a first organic compound and a second gas containing a second organic compound are supplied to the chamber, and
   the organic film is formed by polymerization of the first organic compound and the second organic compound.

8. The plasma processing method of claim 7, wherein a heater is provided in the focus ring, and
   in said forming the organic film, the focus ring is heated by the heater so that the polymerization occurs selectively on the focus ring.

9. The plasma processing method of claim 6, wherein a heater is provided in the focus ring, and
   in said forming the organic film, the focus ring is heated by the heater so that a polymerization occurs selectively on the focus ring.

10. The plasma processing method of claim 5, wherein in said forming the organic film, a first gas containing a first organic compound and a second gas containing a second organic compound are supplied to the chamber, and
    the organic film is formed by polymerization of the first organic compound and the second organic compound.

11. The plasma processing method of claim 10, wherein a heater is provided in the focus ring, and
    in said foiling the organic film, the focus ring is heated by the heater so that a polymerization occurs selectively on the focus ring.

12. The plasma processing method of claim 5, wherein a heater is provided in the focus ring, and
    in said forming the organic film, the focus ring is heated by the heater so that a polymerization occurs selectively on the focus ring.

* * * * *